(12) United States Patent
Yin et al.

(10) Patent No.: US 11,696,399 B2
(45) Date of Patent: Jul. 4, 2023

(54) CIRCUIT BOARD

(71) Applicant: ZTE Corporation, Shenzhen (CN)

(72) Inventors: Changgang Yin, Shenzhen (CN); Bi Yi, Shenzhen (CN); Zhongmin Wei, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/635,916

(22) PCT Filed: Sep. 15, 2020

(86) PCT No.: PCT/CN2020/115357
§ 371 (c)(1),
(2) Date: Feb. 16, 2022

(87) PCT Pub. No.: WO2021/052327
PCT Pub. Date: Mar. 25, 2021

(65) Prior Publication Data
US 2022/0304152 A1    Sep. 22, 2022

(30) Foreign Application Priority Data
Sep. 16, 2019 (CN) .......................... 201910872663.5

(51) Int. Cl.
*H05K 1/11* (2006.01)

(52) U.S. Cl.
CPC ............ *H05K 1/113* (2013.01); *H05K 1/115* (2013.01); *H05K 2201/0939* (2013.01); *H05K 2201/09481* (2013.01); *H05K 2201/09854* (2013.01)

(58) Field of Classification Search
CPC ......... H05K 1/115; H05K 2201/09454; H05K 2201/09463; H05K 2201/09472; H05K 2201/09481; H05K 1/113
See application file for complete search history.

(56) References Cited

U.S. PATENT DOCUMENTS

| 5,414,223 A | 5/1995 | Suski et al. |
| 2008/0073796 A1 | 3/2008 | Harvey et al. |
| 2008/0082950 A1 | 4/2008 | Mathews |
| 2010/0243310 A1 | 9/2010 | Pai et al. |

(Continued)

FOREIGN PATENT DOCUMENTS

| CN | 1822746 A | 8/2006 |
| CN | 1852636 A | 10/2006 |
| CN | 101154644 A | 4/2008 |

(Continued)

OTHER PUBLICATIONS

European Patent Office. Extended European Search Report for EP Application No. 20866258.5, dated Sep. 5, 2022, pp. 1-8.

(Continued)

*Primary Examiner* — Jeremy C Norris
(74) *Attorney, Agent, or Firm* — Vivacqua Crane, PLLC

(57) ABSTRACT

A circuit board is disclosed, including a circuit board body and at least one via apparatus provided on the circuit board body. The via apparatus includes a via (101) formed on the circuit board body, a via pad (201) surrounding the via and separately provided from the via, and an electrical conductor (301) electrically connecting the via pad (201) with the via (101).

7 Claims, 7 Drawing Sheets

(56) References Cited

U.S. PATENT DOCUMENTS

2012/0325542 A1    12/2012  Yokoyama
2018/0212550 A1*  7/2018  Imazeki ................ H05K 1/115

FOREIGN PATENT DOCUMENTS

| | | |
|---|---|---|
| CN | 201657498 U | 11/2010 |
| CN | 107155258 A | 9/2017 |
| EP | 1841298 A2 | 10/2007 |
| EP | 3379905 A1 | 9/2018 |
| JP | 2010087037 A | 4/2010 |
| JP | 2012238848 A | 12/2012 |
| JP | 2014093332 A | 5/2014 |
| JP | 2018163927 A | 10/2018 |
| KR | 20190092211 A | 8/2019 |

OTHER PUBLICATIONS

International Searching Authority. International Search Report and Written Opinion for PCT Application No. PCT/CN2020/115357 and English translation, dated Nov. 27, 2020, pp. 1-9.
Japan Patent Office Notice of Reasons for Refusal for JP Application No. 2022-511343 and English translation, dated Mar. 22, 2023, pp. 1-6.

* cited by examiner

CIRCUIT BOARD

CROSS-REFERENCE TO RELATED APPLICATION

This application is a national stage filing under 35 U.S.C. § 371 of international application number PCT/CN2020/115357, filed Sep. 15, 2020, which claims priority to Chinese patent application No. 201910872663.5 filed Sep. 16, 2019. The contents of these applications are incorporated herein by reference in their entirety.

TECHNICAL FIELD

Embodiments of the disclosure relate to but are not limited to the technical field of electronic power, and in particular, relate to but are not limited to a circuit board.

BACKGROUND

Currently, high-speed product rates have reached more than 25 Gbps, and this poses a great challenge to the signal integrity of high-speed interconnection channels. To meet this challenge, deep optimization design needs to be performed on passive components that form a high-speed interconnection channel. The performance of a via, as a key passive component of the high-speed interconnection channel, directly affects the performance of the signal integrity of the entire high-speed channel. For the via, a main factor affecting signal integrity is that the impedance of the via is lower than that of a transmission wire, resulting in discontinuous impedance. Factors affecting the impedance of the via include aperture, diameter of pad, diameter of anti-pad, dielectric constant, and the like. The sheet material and the aperture generally cannot be changed, optimization of the anti-pad is limited, and a via pad generally needs to be 10 mils larger than the aperture due to drilling alignment and cannot be reduced. As a result, the capacitivity of the via pad is relatively high, which leads to decrease of impedance. Consequently, the impedance of the entire via is relatively low, which affects the signal integrity.

SUMMARY

Embodiments of the disclosure provides a circuit board to address the problems at least to some extent that impedance of a via on a current circuit board is lower than impedance of a signal wire, resulting in discontinuous impedance and affecting signal integrity, and serpentine wiring is used for a differential via on the circuit board, affecting improvement of wiring density.

In view of this, an embodiment of the disclosure provides a circuit board, including a circuit board body and at least one via apparatus provided on the circuit board body, where the via apparatus includes a via formed on the circuit board body, a via pad surrounding the via and separately provided from the via, and an electrical conductor electrically connecting the via pad with the via.

Other features and corresponding beneficial effects of the disclosure are described later in the specification, and it should be understood that at least some of the beneficial effects are apparent from the description of the disclosure.

DETAILED DESCRIPTION

To make objectives, technical schemes and advantages of the disclosure clearer, the following further describes embodiments of the disclosure in detail by using specific implementations with reference to the accompanying drawings. It should be understood that specific embodiments described herein are merely intended to explain the disclosure, but are not intended to limit the disclosure.

Example Embodiment One

Figure 1:
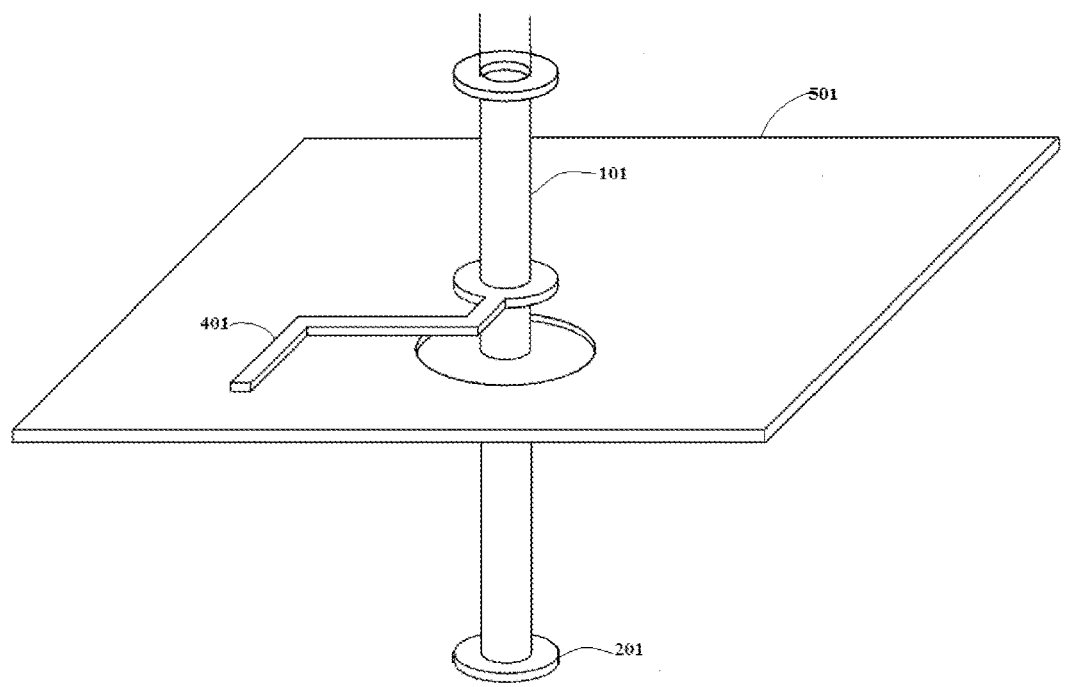
FIG. 1 is an exploded view of a via apparatus.
Figure 2:
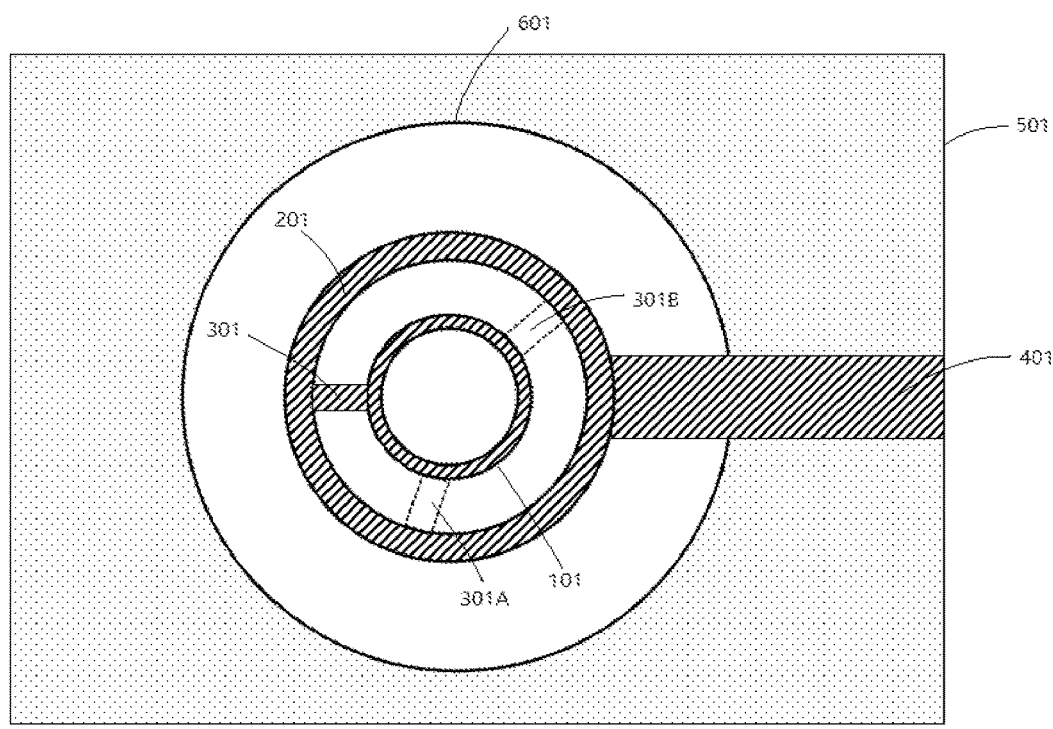
FIG. 2 is a schematic structural diagram of a via apparatus according to example embodiment one of the disclosure.

To increase impedance of a via on a circuit board and improve the signal integrity of the via and a system channel, an embodiment of the disclosure provides a circuit board. FIG. 1 is an exploded view of a via apparatus. FIG. 2 is a schematic structural diagram of a via apparatus on a circuit board body according to an embodiment of the disclosure. The circuit board in this embodiment of the disclosure includes a circuit board body and at least one via apparatus formed on the circuit board body. As shown in FIG. 2, the via apparatus includes a via 101, a via pad 201 surrounding the via 101 and separately provided from the via 101, an electrical conductor 301 electrically connecting the via 101 with the via pad 201, and a signal wire 401.

It can be understood that, in some embodiments, all the via apparatuses on a circuit board may be of the structure of the via apparatus in the disclosure. Alternatively, a part of the via apparatuses on a circuit board are of the structure of the via apparatus in the disclosure, and the other part of the via apparatuses on the circuit board are of a structure of another via apparatus.

A parasitic capacitance of a via is calculated as shown in a formula (1):

$$C = \frac{1.41\varepsilon_r TD1}{D2 - D1} \quad (1)$$

where $\varepsilon_r$ is a PCB dielectric constant, D1 is a diameter of a via pad, and D2 is a diameter of a via anti-pad.

It can be learned from the formula 1 that a larger diameter D1 of the via pad indicates a larger parasitic capacitance of the via.

In addition, according to an impedance formula (2), when the parasitic inductance is constant, a larger parasitic capacitance indicates a lower impedance of the via.

$$Z = \sqrt{\frac{L}{C}} \quad (2)$$

The structure of the via apparatus according to this embodiment of the disclosure is shown in FIG. 2. The via pad used in this embodiment of the disclosure is a circular ring-shaped via pad, a size of a circular outer ring is consistent with a design size of an existing pad, and the via is connected to the pad through the electrical conductor, as shown in FIG. 2. This can greatly reduce a capacitivity of the pad, thereby increasing the overall impedance of the via, so that the impedance of the via better matches impedance of a transmission wire.

Figure 3:
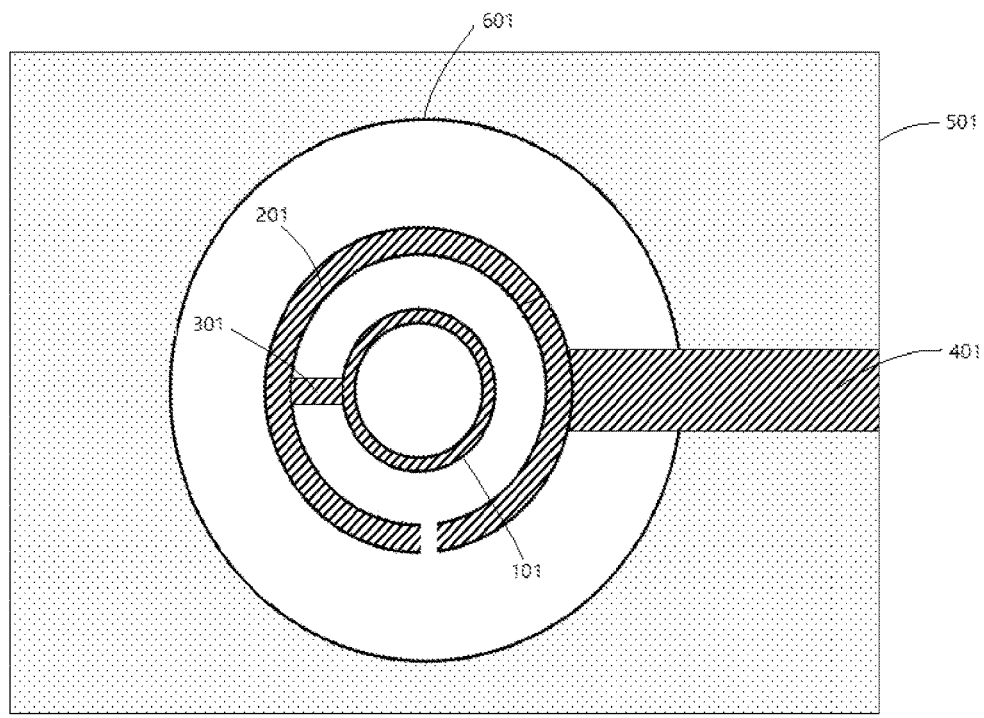
FIG. 3 is a schematic structural diagram of another via apparatus according to example embodiment one of the disclosure.

In some embodiments of the disclosure, the via pad is a non-closed circular pad, as shown in FIG. 3.

Figure 4:
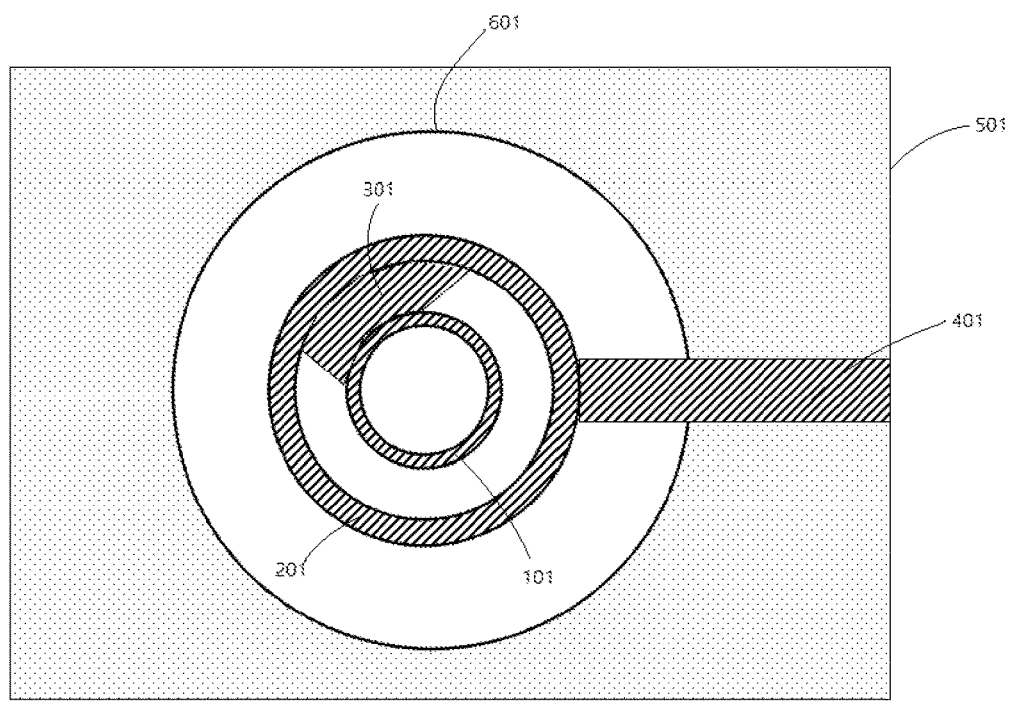
FIG. 4 is a schematic structural diagram of another via apparatus according to example embodiment one of the disclosure.

In some embodiments of the disclosure, the electrical conductor between the via and the via pad has a sector shape, as shown in FIG. 4. It can be understood that the shape of the electrical conductor may be any shape.

Figure 5:
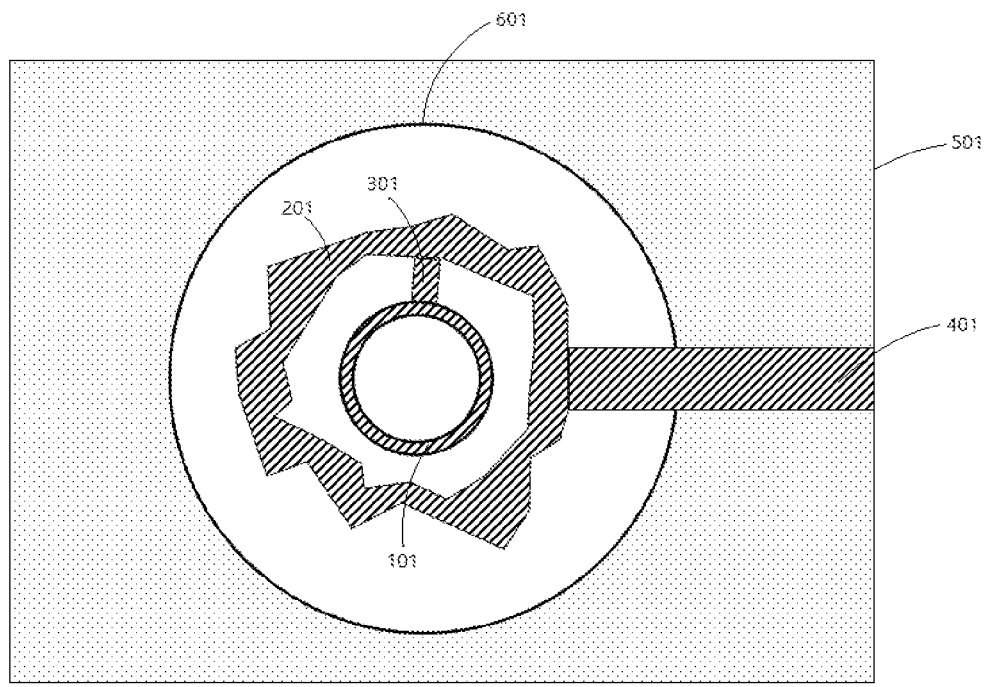
FIG. 5 is a schematic structural diagram of another via apparatus according to example embodiment one of the disclosure.

In some embodiments of the disclosure, the via pad is an irregularly-shaped circular pad, as shown in FIG. 5.

Figure 6:
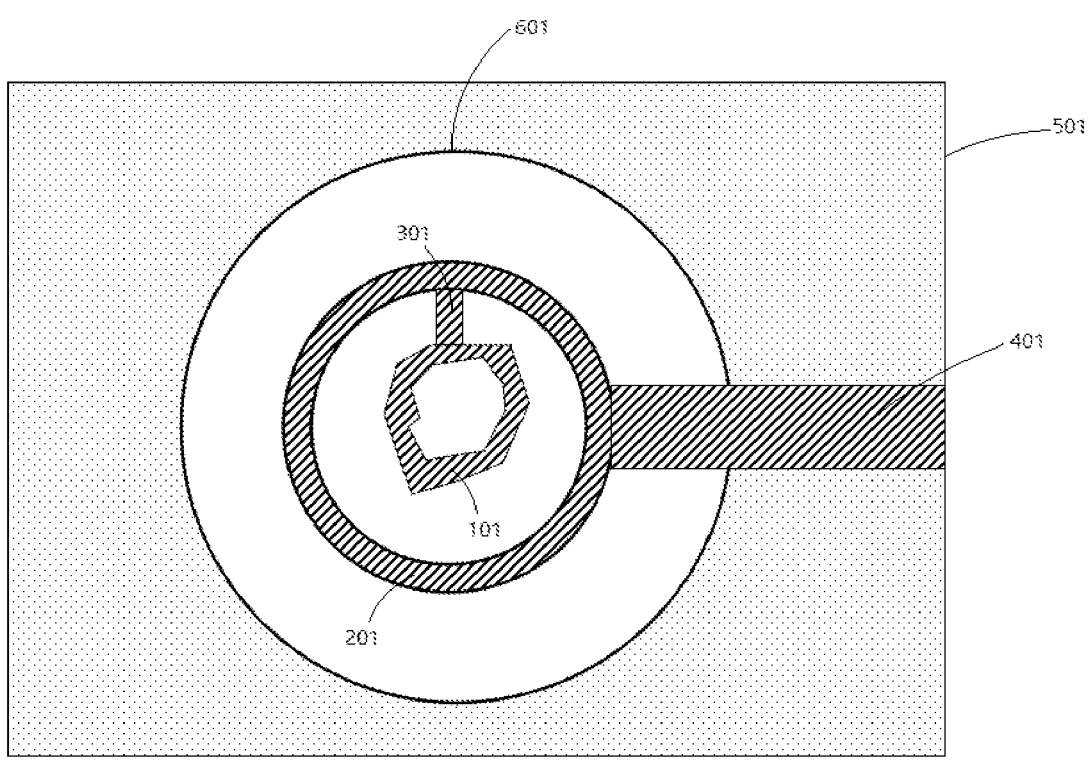
FIG. 6 is a schematic structural diagram of another via apparatus according to example embodiment one of the disclosure.

In some embodiments of the disclosure, the via is an irregularly-shaped via, as shown in FIG. 6.

Beneficial Effects

The circuit board provided in the embodiment of the disclosure includes a circuit board body and at least one via apparatus provided on the circuit board body, where the via apparatus includes a via formed on the circuit board body, a via pad surrounding the via and separately provided from the via, and an electrical conductor electrically connecting the via pad with the via. The capacitivity of the pad is greatly reduced by using a ring-shaped pad. Some implementations include, but not limited to, increasing the impedance of the via, so that the impedance of the via better matches the impedance of a transmission wire, thereby improving the signal integrity of the via and a system channel.

Example Embodiment Two

Figure 7:
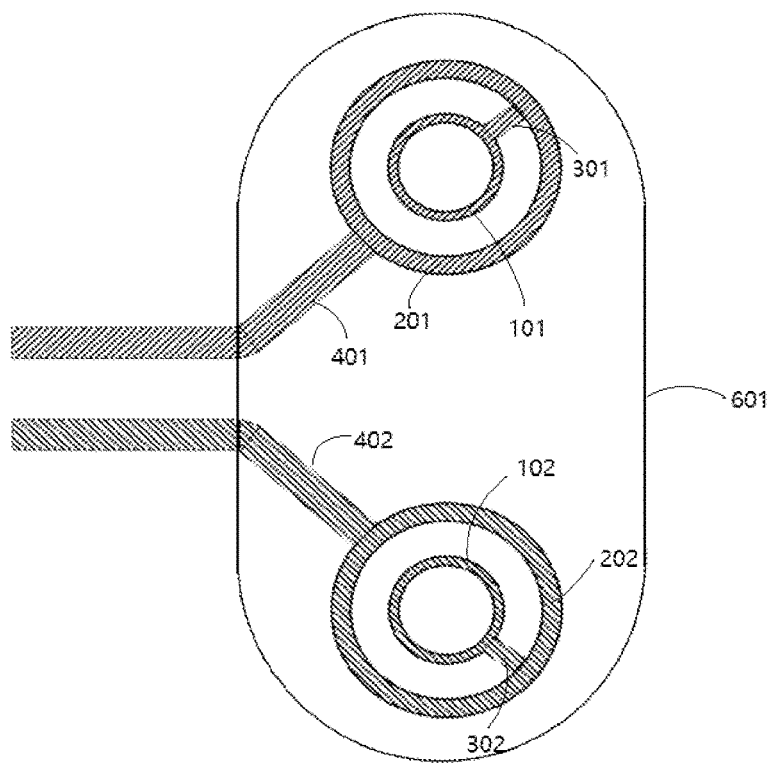
FIG. 7 is a schematic structural diagram of a differential via apparatus according to example embodiment two of the disclosure.
Figure 8:
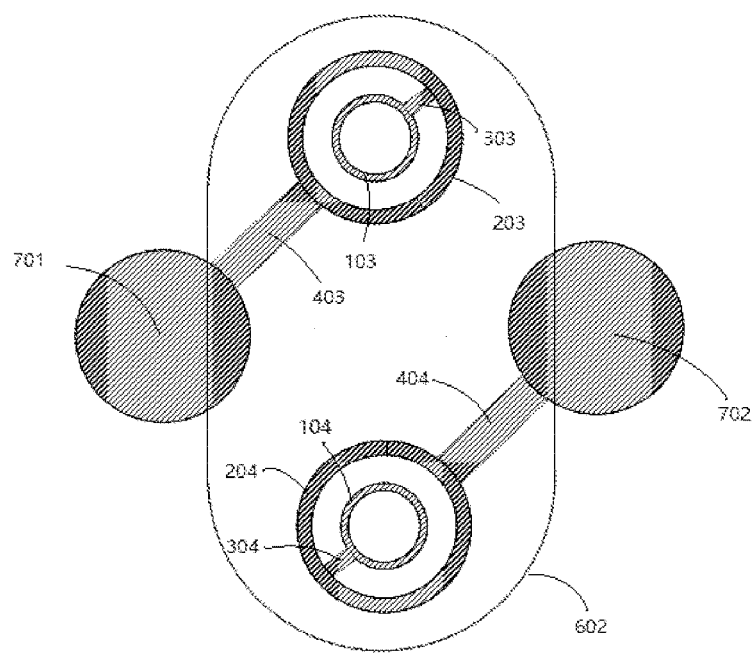
FIG. 8 is a schematic structural diagram of another differential via apparatus according to example embodiment two of the disclosure.

To increase impedance of a via on a circuit board and improve the signal integrity of the via and a system channel, an embodiment of the disclosure provides a circuit board. FIG. 7 is a schematic structural diagram of a differential via apparatus at an inner layer of a circuit board according to an embodiment of the disclosure. FIG. 8 is a schematic structural diagram of a differential via apparatus at a surface layer of a circuit board according to an embodiment of the disclosure.

The circuit board in this embodiment of the disclosure has a structure of BGA (Ball Grid Array) chip differential vias with an interval of 1.0 mm and a hole depth of 3 mm. The circuit board includes a circuit board body, a differential via apparatus at an inner layer of the circuit board, and a differential via apparatus at a surface layer of the circuit board. The differential via apparatus at the inner layer of the circuit board is shown in FIG. 7, and the differential via apparatus includes a via 101, a via 102, a via pad 201 surrounding the via 101 and separately provided from the via 101, a via pad 202 surrounding the via 102 and separately provided from the via 102, an electrical conductor 301 electrically connecting the via 101 with the via pad 201, an electrical conductor 302 electrically connecting the via 102 with the via pad 202, a signal wire 401, and a signal wire 402. The differential via apparatus at the surface layer of the circuit board is shown in FIG. 8, and the differential via apparatus includes a via 103, a via 104, a via pad 203 surrounding the via 103 and separately provided from the via 103, a via pad 204 surrounding the via 104 and separately provided from the via 104, an electrical conductor 303 electrically connecting the via 103 with the via pad 203, an electrical conductor 304 electrically connecting the via 104 with the via pad 204, a signal wire 403, a signal wire 404, a BGA chip welded pad 701, and a BGA chip welded pad 702. In some embodiments of the disclosure, the via pads are all circular ring-shaped pads. Apertures of the via 101, the via 102, the via 103, and the via 104 are all 0.2 mm. The via pad 201, the via pad 202, the via pad 203, and the via pad 204 each have an outer diameter of 0.4 mm and a ring width of 2 mils. The electrical conductor 301, the electrical conductor 302, the electrical conductor 303, and the electrical conductor 304 are all strip-shaped and each have a width of 2 mils.

Because the pads 201 to 204 in this embodiment of the disclosure are no longer circular as a whole in the existing technology but have a ring-shaped structure, an conductor area is greatly reduced. Consequently, the capacitivities of the pad at the surface layer and the pad at the inner layer are reduced. In addition, the ring width of the pad and the width of a connection structure of the electrical conductor are only 2 mils. Therefore, compared with the increase of inductance of the circular pad, it can be learned from the formula (2) that the inductance L increases, the capacitance C decreases, and the impedance increases, so as to increase impedance of the entire via, and improve the signal integrity of the via and a system channel.

Figure 9:
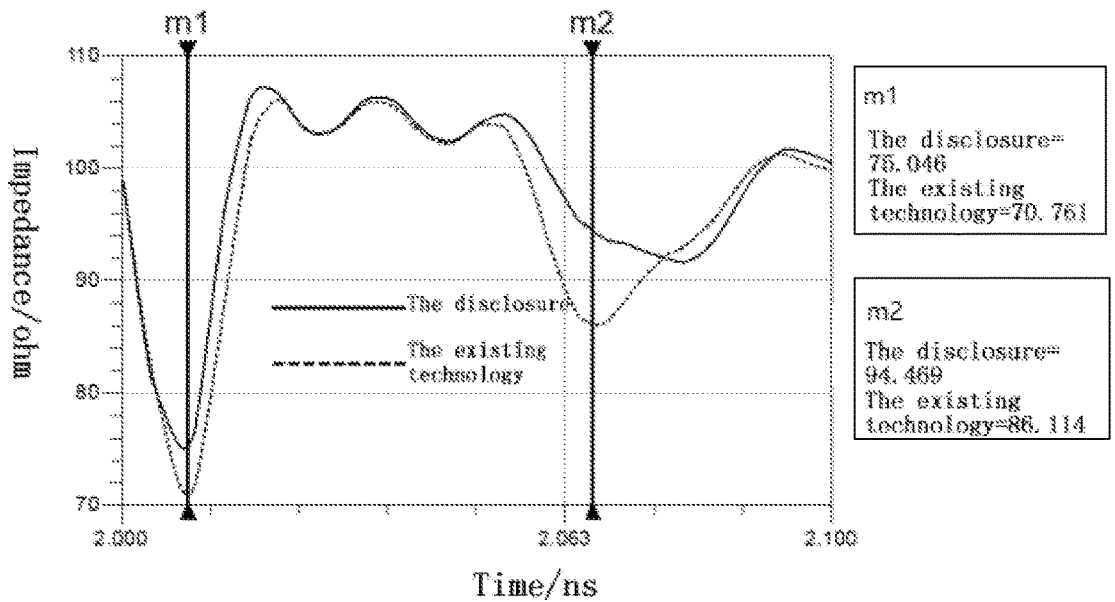
FIG. 9 is a diagram of emulation results of impedance of a BGA differential via that exists before and after the disclosure is adopted according to example embodiment two of the disclosure.
Figure 10:
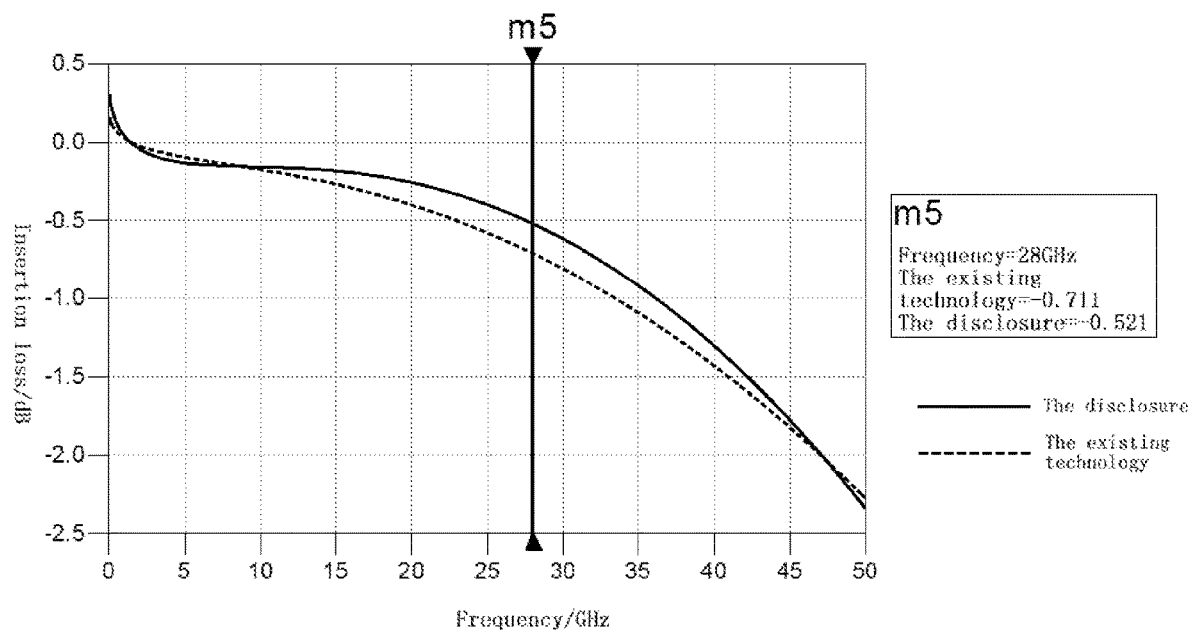
FIG. 10 is a diagram of emulation results of insertion losses of a BGA differential via that exists before and after the disclosure is adopted according to example embodiment two of the disclosure.

Emulation results of impedance and insertion losses of a BGA differential via that exists before and after the disclosure is adopted are shown in FIG. 9 and FIG. 10. In can be learned that, after the disclosure is adopted, impedance of the pad at the surface layer and impedance of the pad at the inner layer are respectively increased by 4.3 ohm and 8 ohm, and the increasing effects are greatly obvious. Compared with the existing design, an insertion loss is reduced by 28%, and the problem of a large insertion loss of the differential via is relieved.

In some embodiments of the disclosure, high-speed crimping connectors with an interval of 1.2 mm are provided on the circuit board, and the hole depth is 2 mm. Because the crimping connector is assembled in a form of crimping, there is no signal wire on the surface layer, but the pad at the surface layer and the pad at the inner layer still exist. Moreover, the impedance of a crimping via is mainly affected by the pad at the inner layer. Similarly, the ring-shaped pad provided in the disclosure may be used, to increase the impedance of the via pad, thereby increasing the impedance of the entire via, and improving the signal integrity of the via and a system channel.

Beneficial Effect

The circuit board provided in the embodiment of the disclosure includes a circuit board body and a differential via apparatus provided on the circuit board body, where the differential via apparatus includes a via formed on the circuit board body, a via pad surrounding the via and separately provided from the via, and an electrical conductor electrically connecting the via pad with the via. The capacitivity of the pad is greatly reduced by using a ring-shaped pad. Some implementations include, but not limited to, increasing impedance of the via, so that the impedance of the via better matches impedance of a transmission wire, thereby improving the signal integrity of the via and a system channel, and relieving the problem of a large insertion loss of the differential via.

Example Embodiment Three

Figure 14:
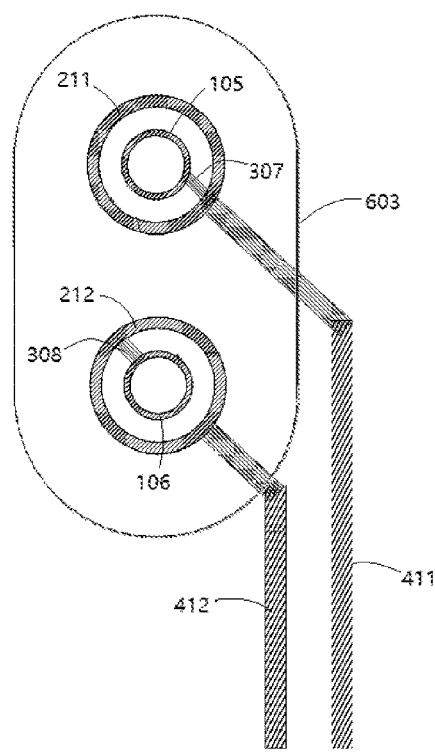
FIG. 14 is a schematic structural diagram of a differential via according to example embodiment three of the disclosure.

To increase impedance of a via of a circuit board, improve the signal integrity of the via and a system channel, and improve the wiring density of a signal wire, an embodiment of the disclosure provides a circuit board. FIG. 14 is a schematic structural diagram of a differential via apparatus according to an embodiment of the disclosure.

Figure 11:
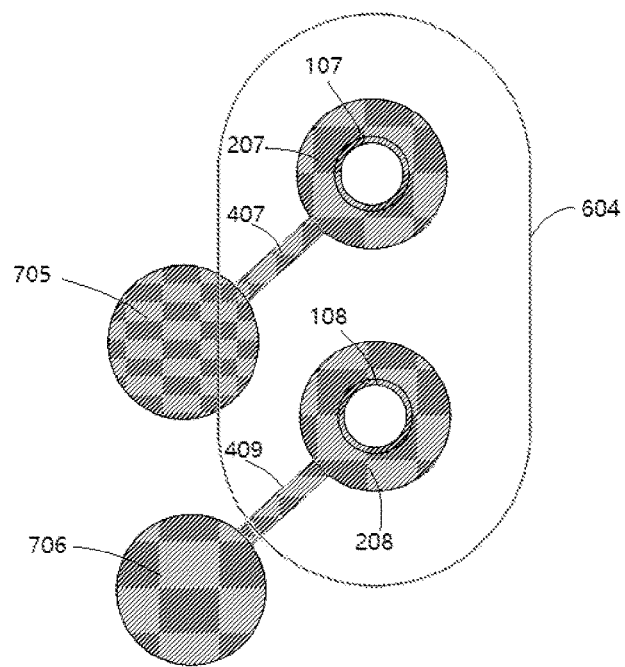
FIG. 11 is a schematic structural diagram of a differential via that exists without adopting the disclosure according to example embodiment three of the disclosure.
Figure 12:
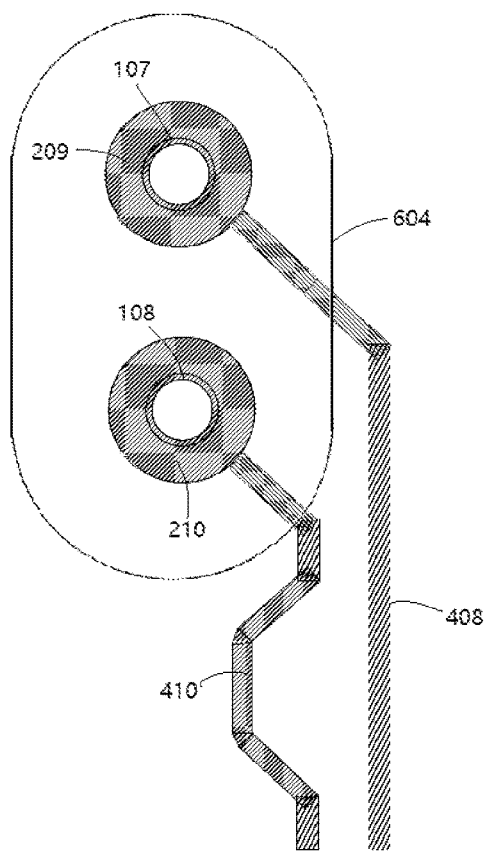
FIG. 12 is a schematic structural diagram of another differential via that exists without adopting the disclosure according to example embodiment three of the disclosure.

This embodiment of the disclosure provides a circuit board. A structure including BGA chip fan-out differential vias with an interval of 1.0 mm is provided on the circuit board. A differential via apparatus at a surface layer of the circuit board is shown in FIG. 11, and the differential via apparatus includes a via 107, a via 108, a via pad 207, a via pad 208, a signal wire 407, a signal wire 409, a BGA chip welded pad 705, and a BGA chip welded pad 706. A differential via apparatus at an inner surface of the circuit board is shown in FIG. 12, and the differential via apparatus includes a via 107, a via 108, a via pad 209, a via pad 210, a signal wire 408, and a signal wire 410. If the signal wire 410 is wired in a straight line, a length of the signal wire 410 is obviously shorter than that of the signal wire 408. In some cases, to resolve the problem that the current has a different phrase due to different lengths that the current flows through, the signal wire 410 is wired in a serpentine shape as shown in FIG. 12, and this occupies more wiring space, affects improvement of wiring density, and does not facilitate reduction of board size of the product.

Figure 13:
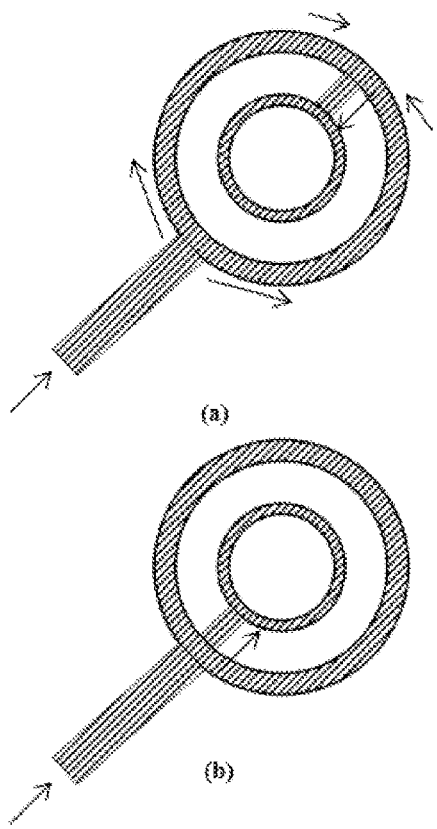
FIG. 13 is a schematic diagram of current path comparison according to example embodiment three of the disclosure.

In this embodiment of the disclosure, a ring-shaped pad is used as the via pad, and a path through which a current flows is changed by changing a location of an electrical conductor. FIG. 13 is a schematic diagram of current path comparison according to an embodiment of the disclosure. As shown in FIG. 13, in (a), after a current enters a pad from a signal wire, the current flows through an entire length of a ring; in (b), after a current enters a pad from a signal wire, the current immediately enters a via through an conductor bar. In case of a same input signal, a path of the current flowing through the signal wire to the electrical conductor and then to the via pad is changed by changing the location of the electrical conductor, so that the signal that finally enters the vias has an obvious phase difference. By using this technology, a phase difference of the differential signal caused by wire bending can be adjusted without performing serpentine wiring, so as to improve wiring density and improve product competitiveness.

FIG. 14 shows a structure of a differential via according to an embodiment of the disclosure. As shown in FIG. 14, the structure of the differential via includes a via 105, a via 106, a via pad 211 surrounding the via 105 and separately provided from the via 105, a via pad 212 surrounding the via 106 and separately provided from the via 106, an electrical conductor 307 electrically connecting the via 105 with the via pad 205, an electrical conductor 308 electrically connecting the via 106 with the via pad 206, a signal wire 411 connected to the via pad 211, and a signal wire 412 connected to the via pad 212. Apertures of the via 105 and the via 106 are both 0.2 mm. The via pad 211 and the via pad 212 each have an outer diameter of 0.4 mm and a ring width of 1.5 mils. The electrical conductor 307 and the electrical conductor 308 are strip-shaped and each have a width of 2 mils. Locations of the electrical conductor 307 and the electrical conductor 308 are adjusted such that the shortest distance of a current passing through the signal wire 411 to the via pad 211, the electrical conductor 307 and then to the via 105 is enabled to be equal to the shortest distance of a current passing through the signal wire 412 to the via pad 212, the electrical conductor 308 and then to the via 106. In this way, a length difference between the signal wire 411 and the signal wire 412 is compensated at the via pad and the electrical conductor, thereby eliminating the need for serpentine wiring and reducing space occupied for wiring.

Beneficial Effect

The circuit board provided in the embodiment of the disclosure includes a circuit board body and a differential via apparatus provided on the circuit board body, where the differential via apparatus includes a via formed on the circuit board body, a via pad surrounding the via and separately provided from the via, and an electrical conductor electrically connecting the via pad with the via. The capacitivity of the pad is greatly reduced by using a ring-shaped pad, and a length difference between signal wires is compensated by changing a location of the electrical conductor. Some implementations include, but not limited to, increasing impedance of the via, so that the impedance of the via better matches impedance of a transmission wire, thereby improving the signal integrity of the via and a system channel, and relieving the problem of a large insertion loss of the differential via. In addition, serpentine wiring is not required, and this can reduce space occupied for wiring and finally improve product competitiveness.

The foregoing content is further detailed description of the embodiments of the disclosure with reference to specific implementations, and cannot be considered that the specific implementation of the disclosure is limited to these descriptions. For a person having ordinary skills in the art to which the disclosure belongs, simple deductions or substitutions may be made without departing from the concept of the disclosure, which shall fall within the protection scope of the disclosure.

The invention claimed is:

1. A circuit board comprising:
   a circuit board body and at least one via apparatus provided on the circuit board body, wherein the via apparatus comprises a via formed on the circuit board body, a via pad surrounding the via and separately provided from the via, and an electrical conductor electrically connecting the via pad with the via, wherein the via apparatus provided on the circuit board body comprises a first via apparatus and a second via apparatus; the first via apparatus comprises a first via, a first via pad surrounding the first via and separately provided from the first via, and a first electrical conductor electrically connecting the first via pad with the first via; and the second via apparatus comprises a second via, a second via pad surrounding the second via and separately provided from the second via, and a second electrical conductor electrically connecting the second via pad with the second via, wherein the circuit board body is further provided with a first signal wire connected to the first via pad and a second signal wire connected to the second via pad, a shortest distance of a current passing through the first via pad to the first electrical conductor and then to the first via is a first distance, and a shortest distance of a current passing through the second via pad to the second electrical conductor and then to the second via is a second distance, and wherein the first signal wire has a length different from a length of the second signal wire, and a sum of the length of the first signal wire and the first distance is equal to a sum of the length of the second signal wire and the second distance.

2. The circuit board of claim 1, wherein the via pad is a ring-shaped pad provided around the via.

3. The circuit board of claim 2, wherein the ring-shaped pad is a circular ring-shaped pad.

4. The circuit board of claim 2, wherein the ring-shaped pad is a closed ring-shaped pad.

5. The circuit board of claim 1, wherein the length of the first signal wire is greater than the length of the second signal wire, and the first distance is smaller than the second distance.

6. The circuit board of claim 1, wherein the first signal wire and the second signal wire are wired using non-serpentine wiring.

7. The circuit board of claim 1, wherein the via is a circular via.

* * * * *